United States Patent
Pryanishnikov et al.

(10) Patent No.: US 6,812,796 B2
(45) Date of Patent: Nov. 2, 2004

(54) INTER-STAGE COUPLING IN MULTISTAGE AMPLIFIERS

(75) Inventors: Vladimir Pryanishnikov, Sunnyvale, CA (US); Alexander Khaydarov, San Jose, CA (US); Oleg Kobildjanov, San Jose, CA (US)

(73) Assignee: 02Micro International Limited, Georgetown (CM)

( * ) Notice: Subject to any disclaimer, the term of this patent is extended or adjusted under 35 U.S.C. 154(b) by 0 days.

(21) Appl. No.: 10/369,037

(22) Filed: Feb. 18, 2003

(65) Prior Publication Data

US 2004/0160275 A1 Aug. 19, 2004

(51) Int. Cl.[7] .............................................. H03F 3/45
(52) U.S. Cl. ...................................... 330/310; 330/260
(58) Field of Search ........................... 330/69, 98, 144, 330/150, 252, 260, 310

(56) References Cited

U.S. PATENT DOCUMENTS

| | | | |
|---|---|---|---|
| 4,296,383 A | * 10/1981 | Jeandot et al. | 330/301 |
| 5,440,271 A | * 8/1995 | Laws | 330/252 |
| 6,069,523 A | * 5/2000 | Brown | 327/563 |
| 6,275,104 B1 | 8/2001 | Holter | 330/149 |
| 6,380,804 B1 | 4/2002 | Ross | 330/51 |
| 6,462,622 B1 | 10/2002 | Mori et al. | 330/302 |

* cited by examiner

Primary Examiner—Steven J. Mottola
(74) Attorney, Agent, or Firm—Grossman, Tucker, Perreault & Pfleger, PLLC

(57) ABSTRACT

A multistage amplifier includes a first gain stage having a first input terminal and a first output terminal, and a second gain stage having a first input terminal. A first inter-stage resistive element is coupled in series to the first output terminal of the first gain stage and the first input terminal of the second gain stage to reduce the adverse affects of one gain stage on a previous gain stage. The multistage amplifier may also have a differential pair with a local feedback path for each transistor of the differential pair. Such local feedback helps to stabilize an imaginary component of the input impedance of the differential amplifier. Such stabilization also helps to reduce the adverse affects one gain stage may have on a previous gain stage.

16 Claims, 5 Drawing Sheets

INTER-STAGE COUPLING IN MULTISTAGE AMPLIFIERS

FIELD OF THE INVENTION

The present invention relates to multistage amplifiers and in particular to high frequency multistage amplifiers with improved inter-stage coupling.

BACKGROUND OF THE INVENTION

Multistage amplifiers may be used in a variety of applications including optical communication systems, satellite communication systems, and mobile communication systems to name only several. In multistage amplifiers, one gain stage may have an adverse affect on a previous stage. This may lead to degradation in overall amplifier performance causing disturbances in output parameters such as frequency response and transitive characteristics.

For instance, a multistage amplifier may have a gain stage including a differential pair with bipolar transistors. Such a differential pair may have a significant capacitive component of the input impedance. This capacitive component plays a dominant role at high frequencies which may impact the performance of a buffer preceding the differential pair. The buffer is typically extremely sensitive to such a capacitive component of the load input impedance. The capacitive component can cause an undesirable high frequency peak on the frequency response curve for the gain stage. This undesirable high frequency peak leads to excessive overshoot and undershoot by as much as 10% of the peak to peak pulse amplitude in the transitive characteristic.

Accordingly, there is a need in the art for a multistage amplifier having improved inter-stage coupling to overcome the above drawbacks of one gain stage adversely affecting a previous gain stage in a multistage amplifier.

BRIEF SUMMARY OF THE INVENTION

A multistage amplifier consistent with the invention includes a first gain stage having a first input terminal and a first output terminal, and a second gain stage having a first input terminal. A first inter-stage resistive element is coupled in series to the first output terminal of the first gain stage and the first input terminal of the second gain stage.

In a further aspect of the invention, a gain stage for a multistage amplifier includes a differential pair having a first transistor and a second transistor. A first feedback path is coupled between a first terminal and a control terminal of the first transistor. The first feedback path is configured to provide a first feedback signal to the control terminal of the first transistor representative of a first signal level at the first terminal of the first transistor. A second feedback path is coupled between a first terminal and a control terminal of the second transistor. The second feedback path is configured to provide a second feedback signal to the control terminal of the second transistor representative of a second signal level at the first terminal of the second transistor.

According to yet a further aspect of the invention there is provided a gain stage for a multistage amplifier including a differential pair, and a feedback path coupled to a first terminal and a control terminal of each pair of transistors of the differential pair. The feedback path is configured to provide a feedback signal to the control terminal representative of a signal at the first terminal.

According to another aspect of the invention there is provided a method of reducing the effect of an imaginary component of an input impedance of a differential stage on a preceding gain stage in a multistage amplifier. The method consistent with the invention includes the steps of: monitoring a signal at a first terminal of each transistor of the differential pair; providing a feedback signal to a control terminal of each transistor of the differential pair; and adjusting the signal at the first terminal of each transistor based on the feedback signal.

BRIEF DESCRIPTION OF THE DRAWINGS

Advantages of the present invention will be apparent from the following detailed description of exemplary embodiments thereof, which description should be considered in conjunction with the accompanying drawings, in which.

DETAILED DESCRIPTION

Figure 1:
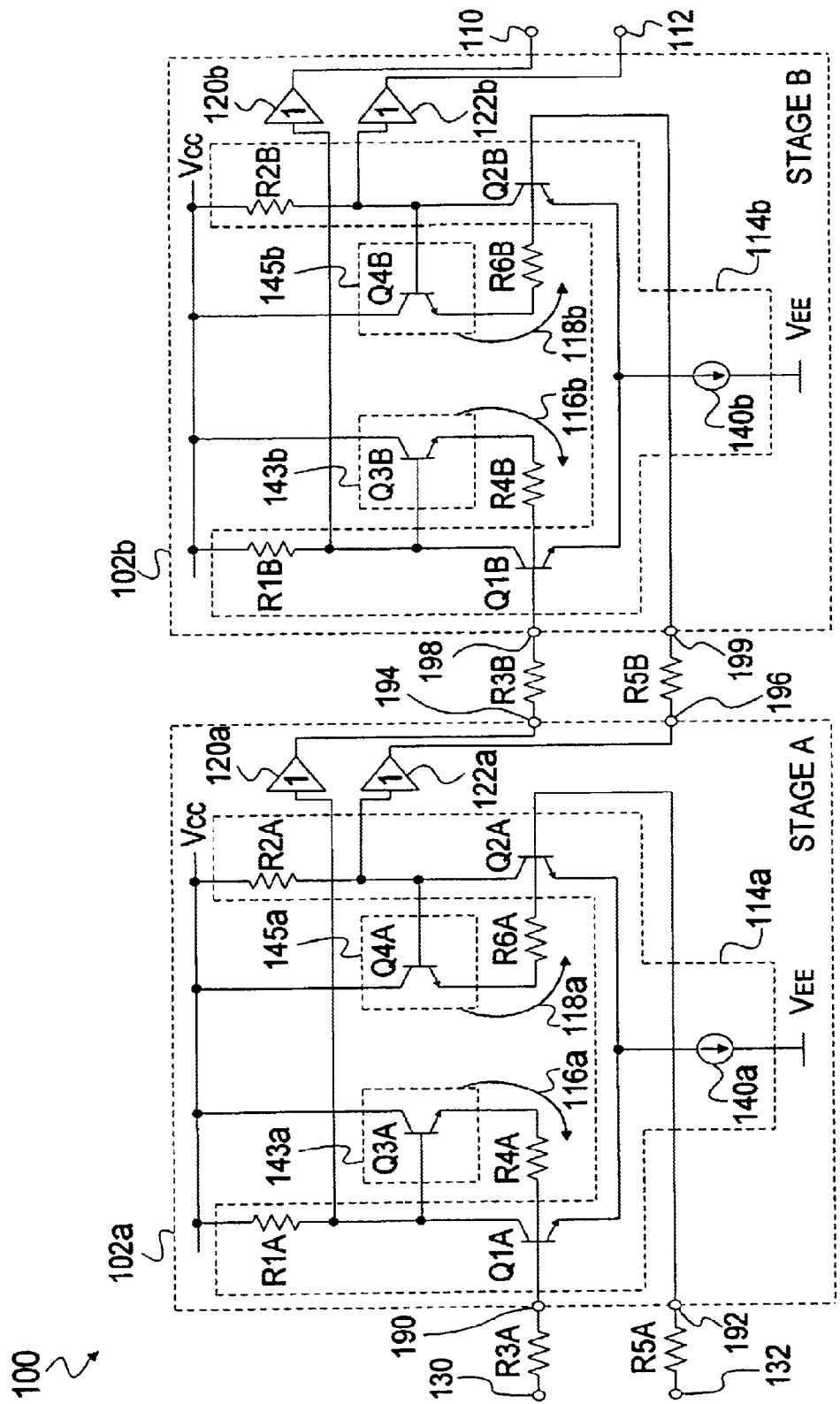
FIG. 1 is a block diagram of an exemplary multistage amplifier consistent with the invention having a first gain stage and second gain stage with an inter-stage resistive element between stages.

FIG. 1 illustrates a block diagram of a multistage amplifier 100 having a plurality of gain stages 102a, 102b. Although only two gain stages 102a, 102b are illustrated, it should be recognized that a multistage amplifier consistent with the invention may have any number of gain stages. In general, the multistage amplifier 100 accepts an input signal at a pair of input terminals 130, 132 and provides an amplified output signal at a pair of output terminals 110, 112 of the second gain stage 102b. The first gain stage may further include one or more input terminals 190, 192 and one or more output terminals 194, 196. The multistage amplifier 100 may be constructed on an integrated circuit by any variety of semiconductor manufacturing processes including a bipolar complementary metal-oxide semiconductor (BiCMOS) process.

The first gain stage 102a generally includes a differential pair 114a, a first feedback path 116a, a second feedback path 118a, a first buffer 120a, and a second buffer 122a. A first inter-stage resistive element (e.g., resistor R3A) and a second inter-stage resistive element (e.g., resistor R5A) may also be coupled to the input terminals 190, 192 of the first gain stage 102a. In general, an input signal from an input source or from a preceding gain stage is accepted at input terminals 190, 192 to the first gain stage 102a via the first and second inter-stage resistive elements R3A and R5A. The first gain stage 102a amplifies the input signal and provides a first gain stage output signal at the output of the first and second buffers 120a, 122a, e.g., at output terminals 194, 196 of the first gain stage 102a.

The differential pair 114a includes a transistor pair Q1A, Q2A biased by a DC current source 140a, and resistors R1A and R2A. The transistor pair Q1A, Q2A may be any class of transistors known in the art. In an exemplary embodiment, the transistors Q1A, Q2A are bipolar NPN type transistors having their respective emitters shorted together. The control terminal, or base terminal of NPN type transistor Q1A, may be coupled to the input terminal 190 of the first gain stage 102a. The input terminal 190 may be further coupled to the first inter-stage resistive element, e.g., resistor R3A, which is then coupled to the input terminal 130 of the multistage amplifier 100.

Similarly, the control terminal, or the base of NPN type transistor Q2A, may be coupled to the other input terminal 192 of the first gain stage 102a and the input terminal 192 may be further coupled the second inter-stage resistive element, e.g., resistor R5A, which is then coupled to the input terminal 132 of the multistage amplifier. Both first and second inter-stage resistive elements may be any combination of a plurality of resistive elements or resistors known in the art to achieve an equivalent series resistance as indicated by single resistors R3A and R5A. The value of the resistors R3A, R5A determines the current value of the input signal to the first stage 102a.

The collector of transistor Q1A may be coupled to the first buffer 120a. Similarly, the collector of transistor Q2A may be coupled to the second buffer 122a. The first gain output signal from the first gain stage 102a may be provided at the output of the first buffer 120a and second buffer 122a at terminals 194, 196 respectively.

Advantageously, the first gain stage 102a has a first feedback path 116a and a second feedback path 118a as described herein to provide respective feedback signals to each transistor Q1A, Q2A representative of the collector signal for each respective transistor Q1A, Q2A. The first feedback path 116a provides a path from the collector of transistor Q1A back to the base of transistor Q1A. The first feedback path 116a may include a first sense element 143a in series with a first resistive element, e.g., resistor R4A. The first sense element 143a may be an active sense element such as transistor Q3A. Transistor Q3A, as illustrated, may be an NPN type bipolar transistor having its control terminal or base coupled to the collector of transistor Q1A, its emitter coupled to the base of transistor Q1A through resistor R4A, and its collector coupled to voltage Vcc. The value of resistor R4A may be selected based, in part, on the particulars of transistors Q1A and Q3A to obtain a desired current level of the feedback signal to the base of transistor Q1A.

Similarly, the second feedback path 118a of the first gain stage 102a is configured to provide a feedback signal to the control terminal of the other transistor Q2A of the differential pair 114a. The second feedback path 118a may include a second sense element 145a in series with a second resistive element, e.g., resistor R6A. The second sense element 145a may be an active sense element such as transistor Q4A. Transistor Q4A, as illustrated, may be an NPN type bipolar transistor having its control terminal or base coupled to the collector of transistor Q2A, its emitter coupled to the base of transistor Q2A through resistor R6A, and its collector coupled to voltage Vcc. The value of resistor R6A may be selected based, in part, on the particulars of transistors Q2A and Q4A to obtain a desired current level of the feedback signal to the base of transistor Q2A.

The second gain stage 102b may have a similar configuration as the first gain stage 102a. That is, the second gain stage 102b may also have a first feedback path 116b and a second feedback path 118b to provide local feedback for each respective transistor Q1B, Q2B of the differential pair 114b. The second gain stage 102b may also include a first inter-stage resistive element, e.g., resistor R3B, and a second inter-stage resistive element, e.g., resistor R5B. Such resistors R3B, R5B may be coupled in series between the output of the buffers 120a, 122a of the first gain stage 102a and the control terminals of transistors Q1B and Q2B of the second gain stage 102b to control the inter-stage coupling current between stages.

In operation, an input signal is received at the input terminals 190, 192 of the first gain stage 102a. The current level of the input signal is determined by the value of the first and second inter-stage resistive elements, e.g., resistors R3A, R5A. This signal is then input to the control terminals of the transistor pair Q1A, Q2A of the differential pair 114a. The feedback paths 116a, 118a provide a feedback signal representative of the signal at the collector of transistors Q1A, Q2A to the base of transistors Q1A, Q2A.

As such, parallel feedback occurs since the input signal at terminals 190, 192 is summed with the feedback signal from the respective feedback paths 116a, 118a for each transistor Q1A and Q2A. This type of feedback reduces the input impedance of the multistage amplifier 100, which strives to zero in case of an increasing feedback signal. Therefore, the feedback paths 116a, 118a enable the imaginary component of the input impedance of the gain stage 102a to be stabilized near zero over a broad range of frequencies, e.g., from about 0 to 10 GHz in one example. This further enables the multistage amplifier 100 to have a gain stage that does not adversely affect the performance of the preceding gain stage. For example, the second gain stage 102b operates similarly as the first gain stage 102a such that the second gain stage 102b does not adversely affect the performance of the first gain stage 102a having buffers 120a, 122a. The inter-stage resistive elements, e.g., resistors R3B and R5B, between the second gain stage 102b and first gain stage 102a normalize the real component of the input impedance. Passive resistors R3B and R5B also have a low imaginary component in their impedance.

Figure 2:
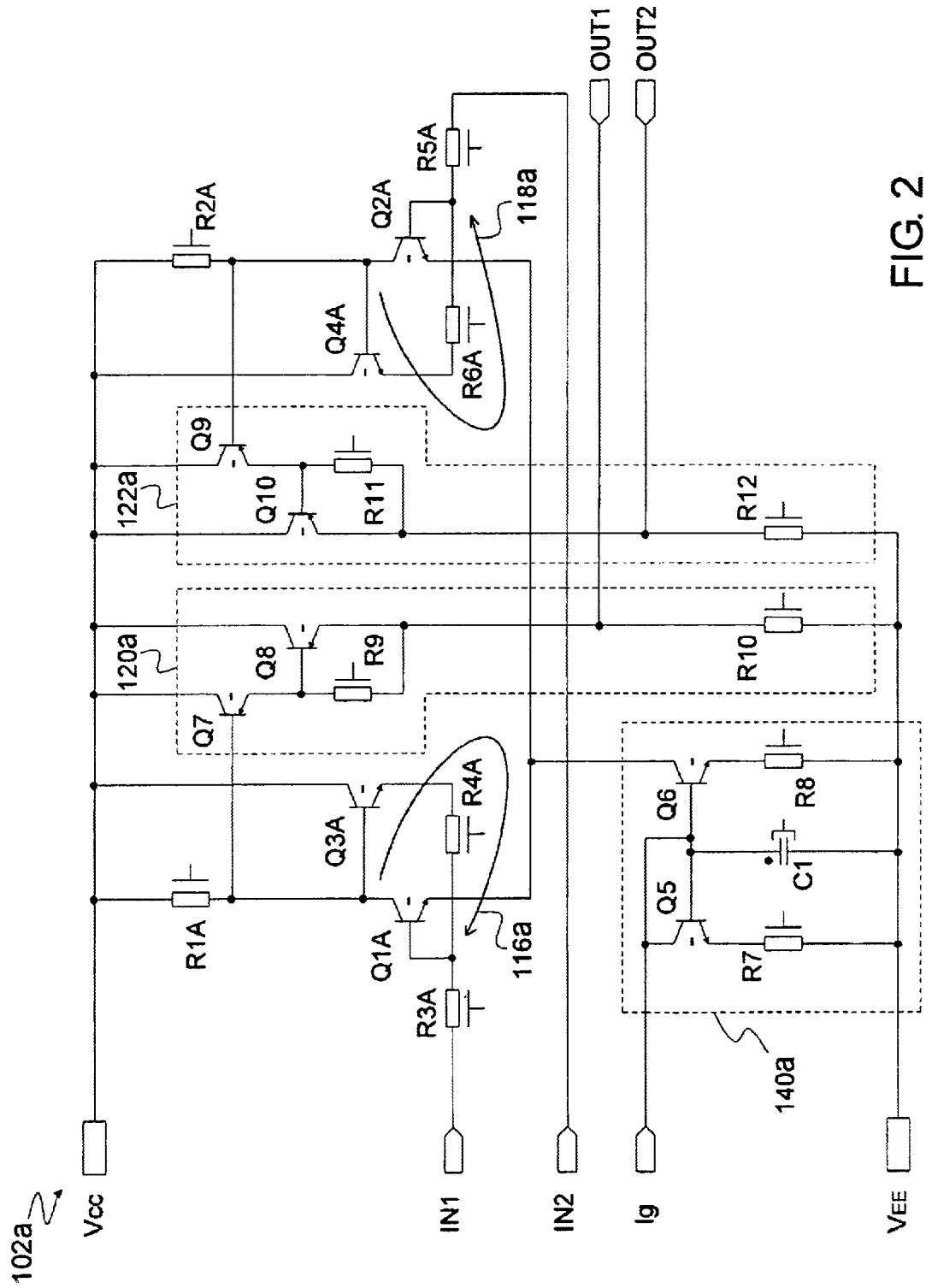
FIG. 2 is an exemplary circuit diagram of an isolated gain stage which may be utilized as the first gain stage of FIG. 1.

Turning to FIG. 2, one exemplary circuit diagram for implementing the first gain stage 102a of FIG. 1 is illustrated. For clarity, like parts of FIG. 2 are labeled similarly as the first gain stage 102a of FIG. 1. Those skilled in the art will recognize that the exemplary circuit diagram of FIG. 2 may be applied to any gain stage.

The differential pair 114a of the gain stage 102a includes a transistor pair Q1A, Q2A biased by a DC biasing portion 140a, and resistors R1A and R2A. The DC biasing portion 140a includes transistors Q5, Q6 with their bases shorted together. The emitter of Q5 may be coupled to resistor R7 and the emitter of transistor Q6 may be coupled to resistor R8. The collector of transistor Q6 may be coupled to the emitter of each transistor Q1A, Q2A to provide DC biasing for the differential pair 114a.

The first feedback path 116a may include transistor Q3A and resistor R4A to provide a feedback signal representative of the collector signal of transistor Q1A to the base of transistor Q1A. Similarly, the second feedback path 118a may include transistor Q4A and resistor R6A to provide a feedback signal representative of the collector signal of transistor Q2A to the base of transistor Q2A.

The collector of the first transistor Q1A of the differential pair 114a may also be coupled to a first buffer 120a. The first buffer 120a may include transistor Q7 having its emitter coupled to resistor R9 forming an emitter follower circuit. The output of this emitter follower circuit may be further coupled to another emitter follower circuit formed by transistor Q8 and resistor R10. The output terminal Out 1 may then be coupled to the output of the emitter follower formed by transistor Q8 and resistor R10.

Similarly, the collector of the other transistor Q2A of the differential pair 114a may be coupled to a second buffer 122a. The second buffer 122a may include transistor Q9 having its emitter coupled to resistor R11 forming an emitter follower circuit. The output of this emitter follower circuit may be further coupled to another emitter follower circuit formed by transistor Q10 and resistor R12. The output terminal Out 2 may then be coupled to the output of the emitter follower formed by transistor Q10 and resistor R12.

Figure 3:
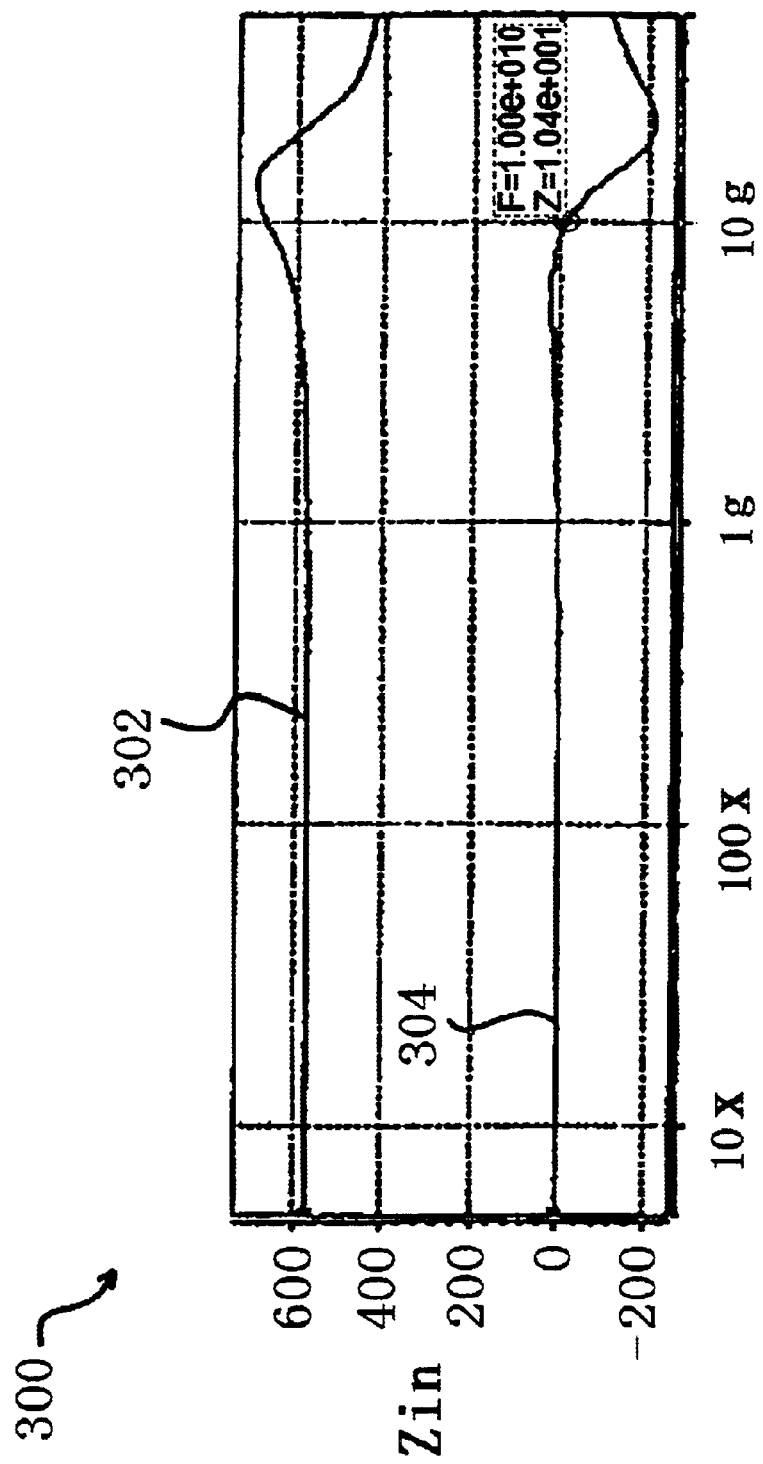
FIG. 3 is an exemplary plot of the real and imaginary components of the input impedance of the gain stage of FIG. 2.

Turning to FIG. 3, an exemplary plot of the real component 302 and the imaginary component 304 of the input impedance of the isolated gain stage 102a of FIG. 2 is illustrated. The real component 302 is about 570 ohms over a frequency range of about 0 to about 2 GHz. The real component climbs to about 674 ohms at 10 GHz and recedes to about 600 ohms at 20 GHz. Advantageously, the plot of the imaginary component 304 is consistently about zero ohms over a wide range of frequency from about 0 to 10 GHz. As such, the imaginary component 304 is normalized about this zero ohm level. As such, any buffers preceding the gain stage 102a are not adversely affected by the imaginary component of the input impedance of the differential pair 114a. In addition, the real component 302 is also normalized at a different level, e.g., about 570 ohms in this instance.

Figure 4:
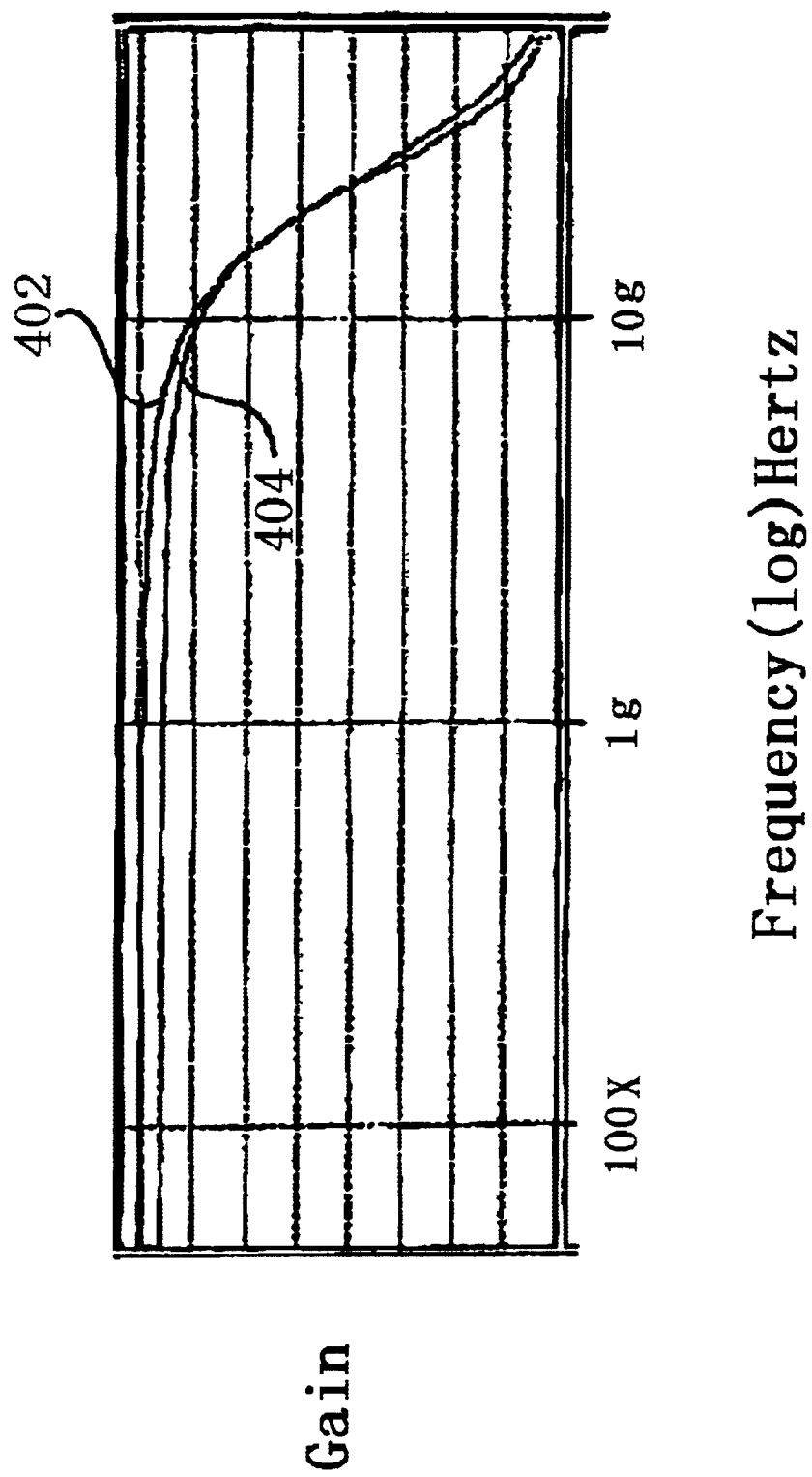
FIG. 4 is an exemplary plot of frequency versus gain illustrating, in one instance, a smooth decline in gain at high frequencies for the circuit of FIG. 2.

Turning to FIG. 4, two exemplary plots 402, 404 of the frequency response for two different simulated conditions are illustrated. The first exemplary plot 402 represents the frequency response for an exemplary isolated gain stage, e.g., gain stage 102a of FIG. 2. Under these conditions, the plot 402 has a smooth decline in gain at a frequency range of about 8 GHz and higher.

The second exemplary plot 404 represents the frequency response of an exemplary gain stage 102a of a two gain stage amplifier 100 having two identical gain stages 102a, 102b, having first 116b and second 118b local feedback paths, without a negative influence on the preceding gain stage 102a. In this instance, the exemplary plot 404 also has a relatively smooth decline in gain at high frequencies of about 8 GHz and higher.

Figure 5:
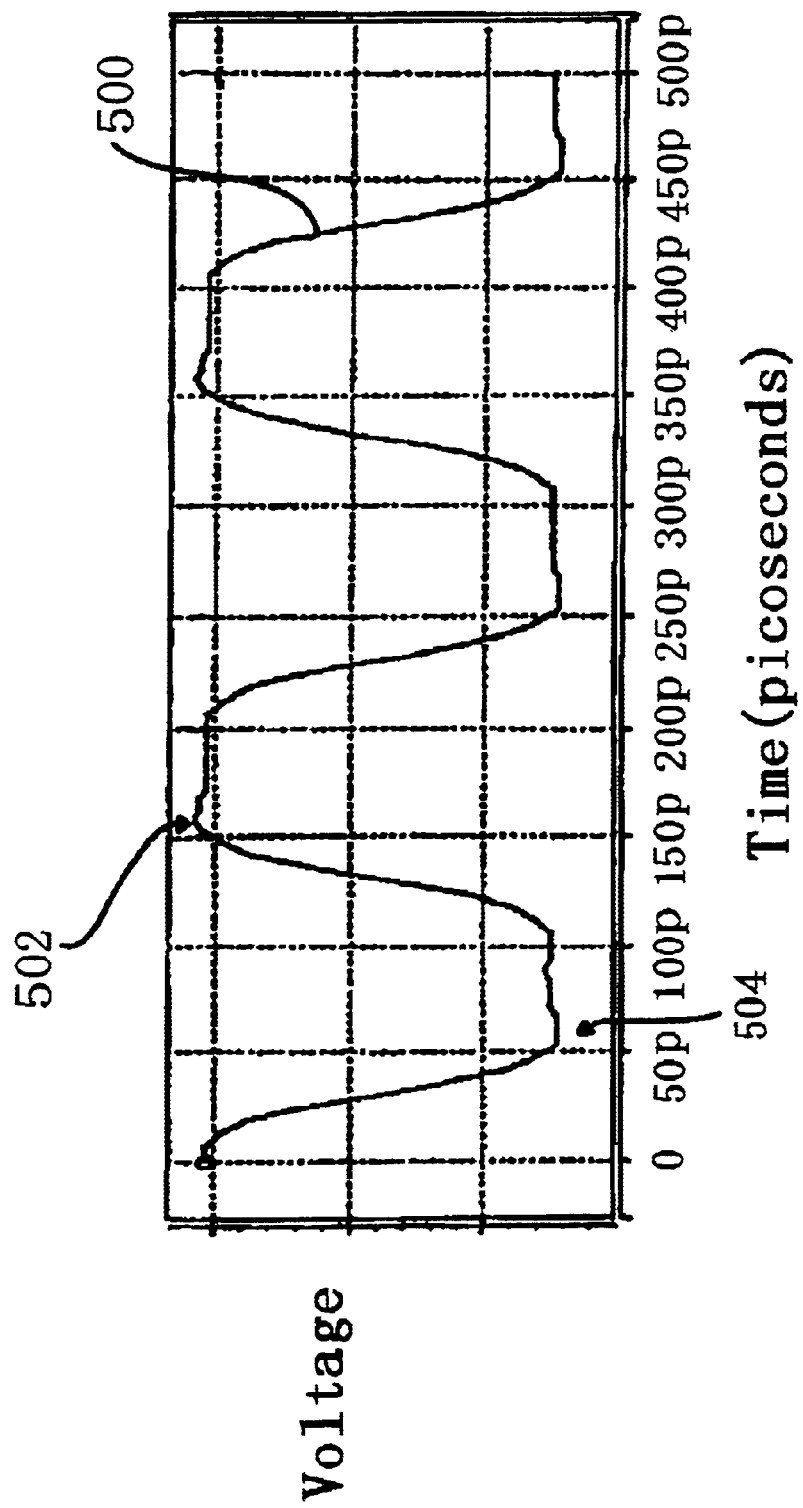
FIG. 5 is an exemplary plot of the transitive characteristics of the circuit of FIG. 2.

The smooth decline in gain at high frequency ranges about 8 GHz and higher as illustrated in the plot 404 of FIG. 4, results in an exemplary transitive characteristic plot 500 as illustrated in FIG. 5. Advantageously, the exemplary plot 500 in FIG. 5 has a pulse shape with an overshoot portion 502 and an undershoot portion 504 that is only about 1% of peak-to-peak pulse amplitude.

The embodiments that have been described herein, however, are but some of the several which utilize this invention and are set forth here by way of illustration but not of limitation. It is obvious that many other embodiments, which will be readily apparent to those skilled in the art, may be made without departing materially from the spirit and scope of the invention as defined in the appended claims.

What is claimed is:

1. A multistage amplifier comprising:
   a first gain stage comprising a first input terminal and a first output terminal;
   a second gain stage comprising: a first input terminal; a differential pair, said differential pair comprising a first transistor and a second transistor; said first feedback path coupled between a first terminal and a control terminal of said first transistor, said first feedback path configured to provide a first feedback signal to said control terminal of said first transistor representative of a first signal level at said first terminal of said first transistor; and a second said second feedback path configured to provide a second feedback signal to said control terminal of said second transistor representative of a second signal level at said first terminal of said second transistor, wherein said first feedback path further comprises a first sense element coupled to said first terminal of said first transistor, said first sense element configured to sense said first signal level at said first terminal of said first transistor, and said second feedback path further comprises a second sense element coupled to said first terminal of said second transistor, said second sense element configured to sense said second signal level at said first terminal of said second transistor; and
   a first inter-stage resistive element coupled in series to said first output terminal of said first gain stage and said first input terminal of said second gain stage.

2. The multistage amplifier of claim 1, wherein said first inter-stage resistive element comprises a resistor.

3. The multistage amplifier of claim 1, wherein said first gain stage further comprises a second input terminal and a second output terminal, said second gain stage comprises a second input terminal, and said multistage amplifier further comprises a second resistive element coupled in series to said second output terminal of said first gain stage and said second input terminal of said second gain stage.

4. The multistage amplifier of claim 1, wherein said first transistor and said second transistor are bipolar transistors.

5. The multistage amplifier of claim 4, wherein said first transistor and said second transistor are NPN type bipolar transistors and said first terminal of said first transistor and said second transistor is a collector and said control terminal of said first transistor and said second transistor is a base.

6. The multistage amplifier of claim 1, wherein said first feedback path comprises a first feedback resistive element coupled in series to said control terminal of said first transistor, and said second feedback path comprises a second feedback resistive element coupled in series to said control terminal of said second transistor.

7. The multistage amplifier of claim 6, wherein said first sense element comprises a first sense transistor, said first sense transistor having a control terminal coupled to said first terminal of said first transistor and a first terminal coupled to said first feedback resistive element and wherein said second sense element comprises a second sense transistor, said second sense transistor having a control terminal coupled to said first terminal of said second transistor and a first terminal coupled to said second feedback resistive element.

8. The multistage amplifier of claim 7, wherein said first sense transistor is an NPN type bipolar transistor, said control terminal of said first sense transistor is a base, said first terminal of said first sense transistor is an emitter, and wherein said second sense transistor is an NPN type bipolar transistor, said control terminal of said second sense transistor is a base, and said first terminal of said second sense transistor is an emitter.

9. An apparatus comprising.
   a multi-stage amplifier, said multi-stage amplifier comprising:
   a first gain stage comprising a first input terminal and a first output terminal;
   a second gain stage comprising: a first input terminal; a differential pair, said differential pair comprising a first transistor and a second transistor; a first feedback path coupled between a first terminal and a control terminal of said first transistor, said first feedback path configured to provide a first feedback signal to said control terminal of sad first transistor representative of a first signal level at said first terminal of said first transistor; and a second feedback path coupled between a first terminal and a control terminal of said second transistor, said second feedback path configured to provide a second feedback signal to said control terminal of said second transistor representative of a second signal level at said first terminal of said second transistor, wherein said first feedback path further comprises a first sense element coupled to said first terminal of said first transistor, said sense element configured to sense said first signal level at said first terminal of said first transistor, and said second feedback path further comprises a second sense element coupled to said first terminal of said second transistor, said second sense element configured to sense said second signal level at said first terminal of said second transistor, and a first inter-stage resistive element coupled in series to said first output terminal of said first gain stage and said first input terminal of said second gain stage.

10. The apparatus of claim 9, wherein said first inter-stage resistive element comprises a resistor.

11. The apparatus of claim 9, wherein said first gain stage further comprises a second input terminal and a second out terminal, said second gain stage comprises a second input terminal and said multistage amplifier further comprises a second resistive element coupled in series to said second output terminal of said gain stage and said second input terminal of said second gain stage.

12. The apparatus of claim 9, wherein said first transistor and said second transistor are bipolar transistors.

13. The apparatus of claim 12, wherein said first transistor and said second transistor are NPN type bipolar transistors and said first terminal of said first transistor and said second transistor is a collector and said control terminal of said first transistor and said second transistor is a base.

14. The apparatus of claim 9, wherein said first feedback path comprises a first feedback resistive element coupled in series to said control terminal of said first transistor, and said second feedback path comprises a second feedback resistive element coupled in series to said control terminal of said second transistor.

15. The apparatus of claim 14, wherein said first sense element comprises a first sense transistor, said first sense transistor having a control terminal coupled to said first terminal of said first transistor and a first terminal coupled to said first feedback resistive element, and wherein said second sense element comprises a second sense transistor, said second sense transistor having a control coupled to said first terminal of said second transistor and a first terminal coupled to said second feedback resistive element.

16. The apparatus of claim 15, wherein said first sense transistor is an NPN type bipolar transistor, said control terminal of said first sense transistor is a base, said first terminal of said first sense transistor is an emitter, and wherein said second sense transistor is an NPN type bipolar transistor, said control terminal of said so sense transistor is a base, and said first terminal of said second sense transistor is an emitter.

* * * * *